(12) United States Patent
Koshiba

(10) Patent No.: US 8,072,007 B2
(45) Date of Patent: Dec. 6, 2011

(54) BACKSIDE-ILLUMINATED IMAGING DEVICE

(75) Inventor: Masaaki Koshiba, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 68 days.

(21) Appl. No.: 12/142,569

(22) Filed: Jun. 19, 2008

(65) Prior Publication Data

US 2009/0045415 A1 Feb. 19, 2009

(30) Foreign Application Priority Data

Jun. 22, 2007 (JP) .............................. P2007-165018

(51) Int. Cl.
*H01L 27/15* (2006.01)

(52) U.S. Cl. ............ 257/228; 257/225; 257/59; 257/72; 257/292; 257/291; 257/273; 257/98; 257/80

(58) Field of Classification Search .................... 257/80, 257/440, 432, 460–461, 463–464
See application file for complete search history.

(56) References Cited

U.S. PATENT DOCUMENTS

| 6,756,618 | B2 * | 6/2004 | Hong ............................ 257/292 |
| 7,456,384 | B2 * | 11/2008 | Toda ............................ 250/226 |
| 7,535,073 | B2 * | 5/2009 | Ezaki ............................ 257/440 |
| 2005/0139828 | A1 | 6/2005 | Maruyama et al. | |

FOREIGN PATENT DOCUMENTS

| JP | 11-355790 A | 12/1999 |
| JP | 2004-304706 A | 10/2004 |
| JP | 2005/142221 A | 6/2005 |
| JP | 2006-73682 A | 3/2006 |

\* cited by examiner

*Primary Examiner* — Wai Sing Louie
*Assistant Examiner* — Bilkis Jahan
(74) *Attorney, Agent, or Firm* — Birch, Stewart, Kolasch & Birch, LLP

(57) ABSTRACT

A backside-illuminated imaging device is provided and includes: a plurality of charge accumulating areas in the semiconductor substrate which accumulate the electric charges; and a plurality of filters above a backside surface of the semiconductor substrate corresponding to the respective charge accumulating areas. The plurality of filters includes different color filters which transmit different color components of the light from one another and luminance filters each having a spectral characteristic correlated with a luminance component of the light, the plurality of charge accumulating areas includes first charge accumulating areas corresponding to the respective color filters, and second charge accumulating areas corresponding to the respective luminance filters, and the second charge accumulating areas includes a third charge accumulating area having a size larger than those of the first accumulating areas.

10 Claims, 3 Drawing Sheets

BACKSIDE-ILLUMINATED IMAGING DEVICE

This application is based on and claims priority under 35 U.S.C. §119 from Japanese Patent Application No. 2007-165018 filed Jun. 22, 2007, the entire disclosure of which is herein incorporated by reference.

BACKGROUND OF THE INVENTION

1. Field of the Invention

The present invention is related to a backside-illuminated imaging device that performs imaging by illuminating light from a back side of a semiconductor substrate to generate electric charges in the semiconductor substrate based on the light and reading out the electric charges from a front side of the semiconductor substrate.

2. Description of Related Art

Various kinds of backside-illuminated imaging devices are proposed, each of which performs preformed imaging by illuminating light from a back side of a semiconductor substrate to generate electric charges in the semiconductor substrate based on the light, accumulating the electric charges in the charge accumulating areas formed on a front side of the semiconductor substrate, and output signals in accordance with the electric charges accumulated in the charge accumulating areas to the outside of the device by CCD or CMOS circuit or the like formed on the front side of semiconductor substrate (e.g., JP-A-2005-142221).

Also, JP-A-11-355790 discloses an imaging device in which a first photosensitive element group including photosensitive elements arrayed in a square lattice pattern for detecting luminescent components of light and a second photosensitive element group including photosensitive elements arrayed in a square lattice pattern for detecting hue components of the light are arranged on a silicon substrate in such a manner that the first and second photosensitive element groups are shifted from each other at adjacent positions so as to form a so-called honeycomb array pattern.

The backside-illuminated imaging device disclosed in JP-A-2005-142221 is a CMOS type imaging device. If the backside-illuminated imaging device is a CCD type imaging device, light receiving areas can be made larger since it is not necessary to provide CCD on the back side of the semiconductor substrate. However, if the light receiving areas become large, the distance between the charge accumulating areas located adjacent to each other becomes short. As a result, there are many possibilities that mixed colors may readily occur in peripheral portions of the backside-illuminated imaging device, in which incident angles of light are steep.

When a color filter array capable of realizing the device characteristics disclosed in JP-A-11-355790 is used as a color filter array provided above the backside surface of the semiconductor substrate, there is a probability that at the peripheral portion of the imaging device, light passing through the filter provided above a photosensitive element for detecting a hue component may be entered into a photosensitive element for detecting a luminance component and also light passing through the filter provided above the photosensitive element for detecting a luminance component may be entered into the photosensitive element for detecting a hue component. If light to be originally entered into a photosensitive element enters into its adjoining photosensitive element that is for detecting a luminance component, this is not any major problems, since the sensitivity of the photosensitive element for detecting a luminance component is high. However, if light to be originally entered to a photosensitive element for detecting a luminance component enters into a photosensitive element for detecting a hue component, S/N of signals acquired from the photosensitive element for detecting a hue component is deteriorated and adverse influences given to image qualities are increased.

SUMMARY OF THE INVENTION

An object of the invention is to provide a backside-illuminated imaging device capable of preventing an occurrence of mixed colors and also capable of performing an imaging operation with a high image quality.

According to an aspect of the invention, there is provided a backside-illuminated imaging device that performs imaging by illuminating light from a back side of a semiconductor substrate to generate electric charges in the semiconductor substrate based on the light and reading out the electric charges from a front side of the semiconductor substrate. The backside-illuminated imaging device includes: a plurality of charge accumulating areas in the semiconductor substrate which accumulate the electric charges; and a plurality of filters above a backside surface of the semiconductor substrate corresponding to the respective charge accumulating areas. The plurality of filters includes different color filters which transmit different color components of the light from one another and luminance filters each having a spectral characteristic correlated with a luminance component of the light, the plurality of charge accumulating areas includes first charge accumulating areas corresponding to the respective color filters, and second charge accumulating areas corresponding to the respective luminance filters, and the second charge accumulating areas includes a third charge accumulating area having a size larger than those of the first accumulating areas.

In the backside-illuminated imaging device, the third charge accumulating area may have an edge portion on the back side of the semiconductor substrate, and the edge portion may be wider than the first charge accumulating areas in a direction parallel to the backside surface of the semiconductor substrate so that the third charge accumulating area can have a size larger than those of the first accumulating areas.

In the backside-illuminated imaging device, the third charge accumulating area may extend toward the backside surface of the semiconductor substrate as compared with the first charge accumulating areas, so that the third charge accumulating area can have a size larger than those of the first accumulating areas.

In the backside-illuminated imaging device, the third charge accumulating area may be located at a peripheral portion of the backside-illuminated imaging device.

In the backside-illuminated imaging device, sizes of third charge accumulating areas may be changed depending on incident angles of light entered to luminance filters corresponding to the respective third charge accumulating areas.

BRIEF DESCRIPTION OF THE DRAWINGS

The features of the invention will appear more fully upon consideration of the exemplary embodiments of the inventions, which are schematically set forth in the drawings, in which.

DETAILED DESCRIPTION OF THE EXEMPLARY EMBODIMENTS

According to an exemplary embodiment of the invention, it is possible to provide a backside-illuminated imaging device capable of performing an imaging operation in the high image quality, while preventing mixed colors from occurring.

Hereinafter, exemplary embodiments of the invention will be described with reference to the drawings.

Figure 1:
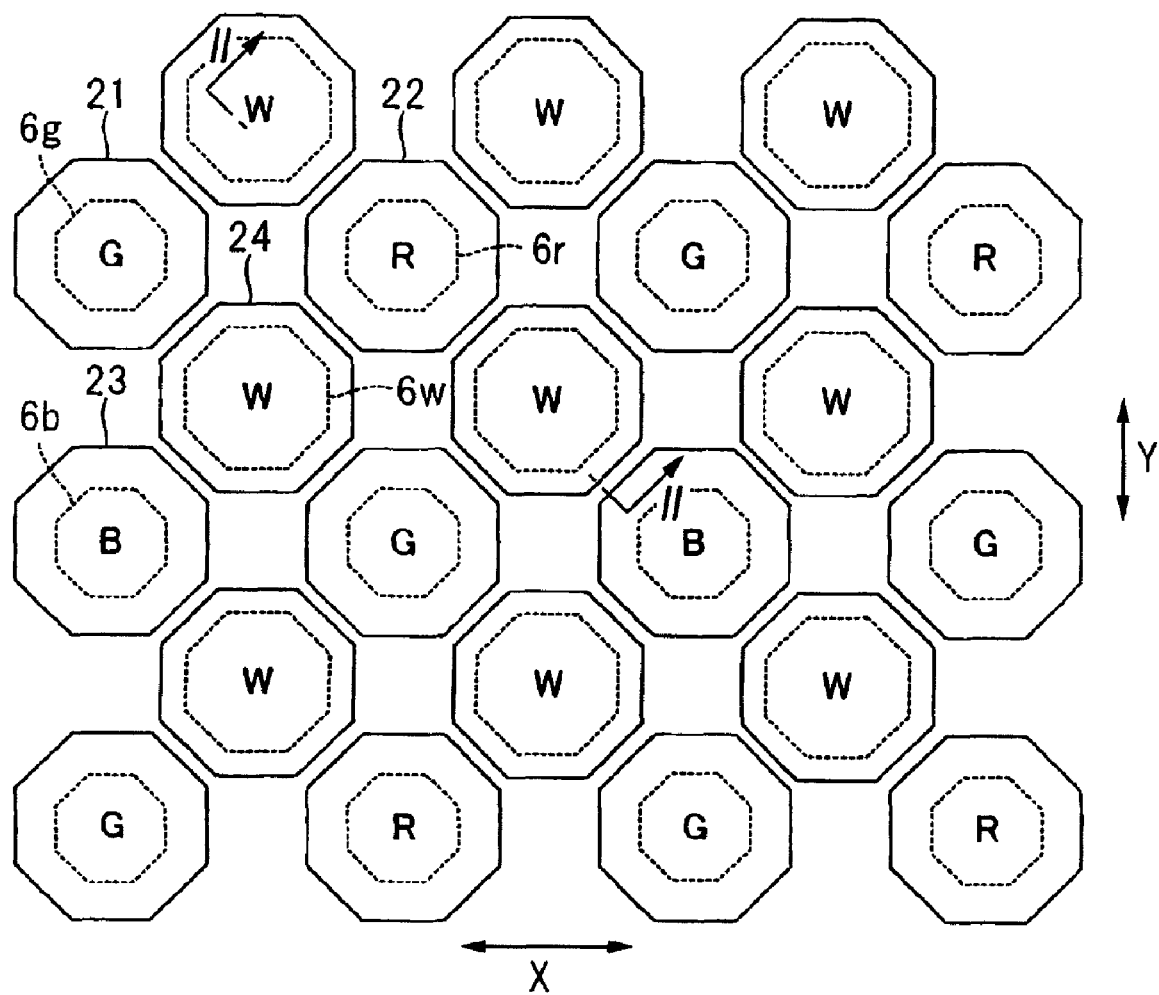
FIG. 1 is a schematic plan view of a backside-illuminated imaging device, as viewed from the side of the backside surface thereof.

FIG. 1 is a schematic plan view of a backside-illuminated imaging device according to an exemplary embodiment of the invention, as viewed from the side of the backside surface thereof.

The backside-illuminated imaging device shown in FIG. 1 includes: a first group in which a large number of charge accumulating areas (6r, 6g, 6b) are arrayed in a square lattice pattern extending a row direction X and a column direction Y perpendicular to the row direction X in a semiconductor substrate; and a second group in which a large number charge accumulating areas (6w) are arrayed in a square lattice pattern extending the row direction X and the column direction Y in the semiconductor substrate. The total number of the charge accumulating areas in the first group is equal to the total number of the charge accumulating areas in the second group.

The respective charge accumulating areas in the first group are arranged at positions shifted from reference positions, which are positions of the respective charge accumulating areas 6w, in a direction (lower left direction inclined at angles of 45 degrees in FIG. 1) so that each of the charge accumulating areas 6w in the second group lies adjacent to one charge accumulating area of the charge accumulating areas in the first group. The charge accumulating areas as a whole are arranged in a so-called honeycomb array. In other words, a large number of the charge accumulating areas in the backside-illuminated imaging device are constructed as such an arrangement described in JP-A-10-136391, namely, a plurality of charge accumulating area arrays, which includes a plurality of charge accumulating areas arrayed in the Y direction in a constant pitch, are arranged in the X direction in the constant pitch; and two sets of adjoining charge accumulating arrays are mutually shifted in the Y direction in an approximately half of the array pitch of the Y direction of the charge accumulating areas in these two charge accumulating area arrays.

Components of light entered to the respective charge accumulating areas 6r, 6g, 6b, 6w are different from one another by filters formed above light receiving surfaces thereof.

As to the charge accumulating area 6r, an R color filter 22 which transmits a red (R) component of light is formed on the light receiving surface thereof, so that the charge accumulating area 6r functions as a photoelectric converting element for detecting the R component of the light. As to the charge accumulating area 6g, an G color filter 21 which transmits a green (G) component of light is formed on the light receiving surface thereof, so that the charge accumulating area 6g functions as a photoelectric converting element for detecting the G component of the light. As to the charge accumulating area 6b, an R color filter 23 which transmits a blue (B) component of light is formed on the light receiving surface thereof, so that the charge accumulating area 6b functions as a photoelectric converting element for detecting the B component of the light. As to the charge accumulating area 6w, a luminance filter 24 having a spectral characteristic correlated with a luminance component of the light is formed on the light receiving surface thereof, so that the charge accumulating area 6w functions a photoelectric converting element for detecting the luminance component of the light.

The luminance filter is an ND filter, a transparent filter, a white filter, a gray filter, or the like. Alternatively, a structure where no filter is provided above the light receiving surface of the charge accumulating area 6w and light is directly entered into the light receiving surface may be referred to as a luminance filter being employed.

The color filters formed above the light receiving surfaces of the respective charge accumulating areas in the first group are arranged in a Bayer array. In other words, the charge accumulating areas in the first group are arranged in such a manner that RG charge accumulating area columns in which the charge accumulating area 6r and the charge accumulating area 6g are alternately arrayed in the X direction and GB charge accumulating area columns in which the charge accumulating area 6g and the charge accumulating are 6b are alternately arrayed in the X direction are alternately arrayed in the Y direction.

Figure 2:
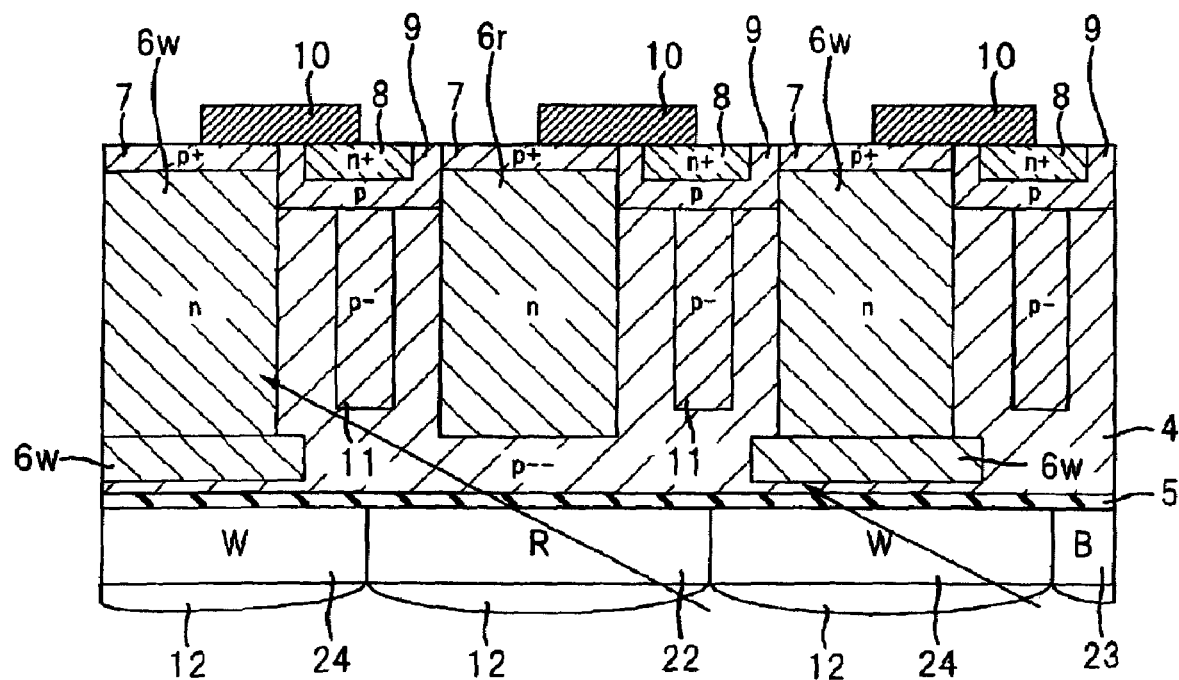
FIG. 2 is a sectional view for schematically showing the backside-illuminated imaging device, taken along a line II-II shown in FIG. 1.

FIG. 2 is a diagram for schematically showing a sectional view, taken along a line II-II of the backside-illuminated imaging device shown in FIG. 1.

As shown in FIG. 2, the backside-illuminated imaging device includes a p type semiconductor substrate (will be referred to as "p substrate" hereinafter) 4 made of p type silicon. This backside-illuminated imaging device performs an imaging operation by making light entering from a lower portion (as viewed in this drawing) toward an upper portion. In this specification, among two surface perpendicular to the light incident direction of the p substrate 4, one on the light incident side is referred to as a backside surface and the other is referred to as a front surface. Further, a direction perpendicular to both the backside surface and the front surface of the p substrate 4 is defined as a vertical direction and a direction parallel to both the backside surface and the front surface of the p substrate 4 is defined as a horizontal direction. Furthermore, as to elements located on the light incident side rather than the backside surface of the p substrate 4, a direction opposite to the light traveling direction with respect to each of the elements is defined as an upper direction of each of the elements, and as to elements located on the side opposite to the light incident side rather than the backside surface of the p substrate 4, the light traveling direction with respect to each of the elements is defined as an upper direction of each of the elements.

The charge accumulating areas (6r, 6g, 6b, and 6w), which are made of an n-type impurity diffusion layer (hereinafter, referred to as "n layer") in order to accumulate electric charges generated in the p substrate 4 in response to incident light, are arrayed on the same plane elongated along the horizontal direction, which is located in the vicinity of the front surface, in the p substrate 4. Electric charges generated in the charge accumulating areas 6r, 6g, 6b, 6w and electric charges generated in the p substrate 4 on a travel path of light entered into the charge accumulating areas 6r, 6g, 6b, 6w are accumulated in the charge accumulating areas 6r, 6g, 6b, 6w.

A high concentration p type impurity diffusion layer (hereinafter, referred to as "p$^+$ layer") 7 is formed on each of the charge accumulating areas in order to avoid that dark electric charges generated on the front surface of the p substrate 4 are accumulated in the respective charge accumulating areas.

An electric charge transfer channel 8 made of an n layer whose concentration is higher than that of the charge accumulating area is formed at a right adjacent position of the p⁺ layers 7 and the charge accumulating area, but is slightly separated from the charge accumulating area. A p layer 9 whose concentration is lower than that of the p⁺ layers 7 is formed at a peripheral portion of the electric charge transfer channel 8.

An electric charge reading area (not shown) for reading electric charges from the charge accumulating area to the electric charge transfer channel 8 is formed on the p substrate 4, and the p layer 9 between the electric charge transfer channel 8, and the P⁺ layers 7 and the charge accumulating area. An electrode 10 made of polysilicon or the like is formed above the electric charge transfer channel 8 and the electric charge reading area via a gate insulating film (not shown) made of a silicon oxide film, an ONO film, or the like. The electrode 10 commonly has two functions as an electric charge transferring electrode for: applying a voltage to the electric charge transfer channel 8 so as to control an electric charge transferring operation; and an electric charge reading electrode for applying a reading voltage to the electric charge reading area so as to control an electric charge reading operation. A CCD (charge-coupled device) is constructed by the electric charge transfer channels 8 and the electrodes 10 formed above the electric charge transfer channels 8.

An element separation layer 11 made of a p type impurity diffusion layer is formed between adjoining charge accumulating areas under the p layer 9. The element separation layer 11 is for avoiding that electric charges which should be originally accumulated in a charge accumulating area are leaked to the adjoining charge accumulating area thereof.

A transparent insulating layer 5 made of a silicon oxide, a silicon nitride, or the like, which is transparent with respect to incident light, is formed on the backside surface of the p substrate 4. A color filter layer in which the R color filter 22, the G color filter 21, the B color filter 23, and the luminance filter 24 are arrayed in the horizontal direction is formed.

A microlens 12 is formed on each of the color and luminance filters 21 to 24.

In the backside-illuminated imaging device constituted in the above-described manner, light incident on one microlens 12 enters into a filter located under the microlens 12, and then, light passing through the filter enters into an charge accumulating area (for example, charge accumulating area "6w") corresponding to the above-described filter. At this time, electric charges are generated in a portion of the p substrate 4, which constitutes an optical path of the incident light, and the electric charges are moved via a potential slope formed in an area segmented by the element separation layer 11 to the charge accumulating area 6w and then the moved electric charges are accumulated in this charge accumulating area 6w. Also, electric charges generated in the charge accumulating area 6w upon incidence of the light are similarly accumulated in this charge accumulating area 6w. The electric charges accumulated in the charge accumulating areas 6w are read to the electric charge transfer channel 8, transferred by this electric charge transfer channel 8, and converted into signals by an output amplifier, and then, the converted signals are outputted to the outside of backside-illuminated imaging device.

A major feature of the backside-illuminated imaging device according to this embodiment is given as follows: That is, as represented in FIG. 1 and FIG. 2, although the sizes as to the charge accumulating areas 6r, 6g, 6b are made equal to one another, sizes as to the charge accumulating areas 6w provided at peripheral portions where incident angles of incident light become steep among all of the charge accumulating areas 6w are made larger than those of the respective charge accumulating areas 6r, 6g, 6b.

For instance, as shown in FIG. 2, with respect to the charge accumulating areas 6w provided at the peripheral portion, edge portions thereof on the back side of the p substrate 4 are wider in the horizontal direction than the edge portions of the charge accumulating areas 6r, 6g, 6b on the back side of the p substrate 4. As a result, the sizes of the charge accumulating areas 6w are larger than those of the respective charge accumulating areas 6r, 6g, 6b.

According to the above-described structure, when light enters into the imaging element along an oblique direction as indicated by arrows of FIG. 2, although part of oblique light (hereinafter, referred to as "R oblique light") passing through the R color filter 22 enters into the charge accumulating area "6w", another oblique light passing through the luminance filter 24 at the same incident angle as that of the above-described R oblique light enters into a portion of the charge accumulating area 6w, which is extended along the horizontal direction. As a result, it is possible to prevent the incident light containing all the color components from entering into the respective charge accumulating areas 6r, 6g, 6b, and thus, a higher image quality can be realized by preventing the mixed colors. On the other hand, although the R oblique light enters into the charge accumulating area 6w, the electric charge amount accumulated in this charge accumulating area 6w is originally large, so that the relative amount of the noise component caused by the R oblique light becomes small, and therefore, a deterioration in an S/N (signal-to-noise) ratio with respect to the signal acquired from the charge accumulating area 6w is obscure. As a consequence, in accordance with an backside-illuminated imaging device of this embodiment, the S/N of the color signal obtained from each of the charge accumulating areas 6r, 6g, 6b can be improved, while the S/N of the luminance signal obtained from the charge accumulating area 6w can be hardly deteriorated, so that the entire image quality can be improved.

In the above description, all of the sizes of the charge accumulating areas 6w provided at the peripheral portion of the backside-illuminated imaging device are made equal to one another. Alternatively, the sizes of the charge accumulating areas 6w may be changed depending on incident angles of light entering into the charge accumulating areas 6w. That is to say, in the peripheral portions, as the incident angle becomes steeper (portions are located from center portion side toward peripheral portion side), the size may be made larger.

Further, in the above description, the sizes as to only the charge accumulating areas 6w provided at the peripheral portion of the backside-illuminated imaging device are made equal to one another. Alternatively, sizes of all of the charge accumulating areas may be changed depending on incident angles of light entering the respective charge accumulating areas. For instance, since mixed colors do not occurs in the center portion where the incident light substantially vertically enters, the sizes of the charge accumulating area 6w in the central portion may be made equal to the size of each of the charge accumulating areas 6r, 6g, 6b; and the sizes of the charge accumulating areas 6w may be gradually increased from the center portion to the peripheral portion. As abovementioned, the sizes of the charge accumulating areas are changed in accordance with occurrence degrees of the mixed colors, so that the performance of preventing mixed colors can be improved.

Figure 3:
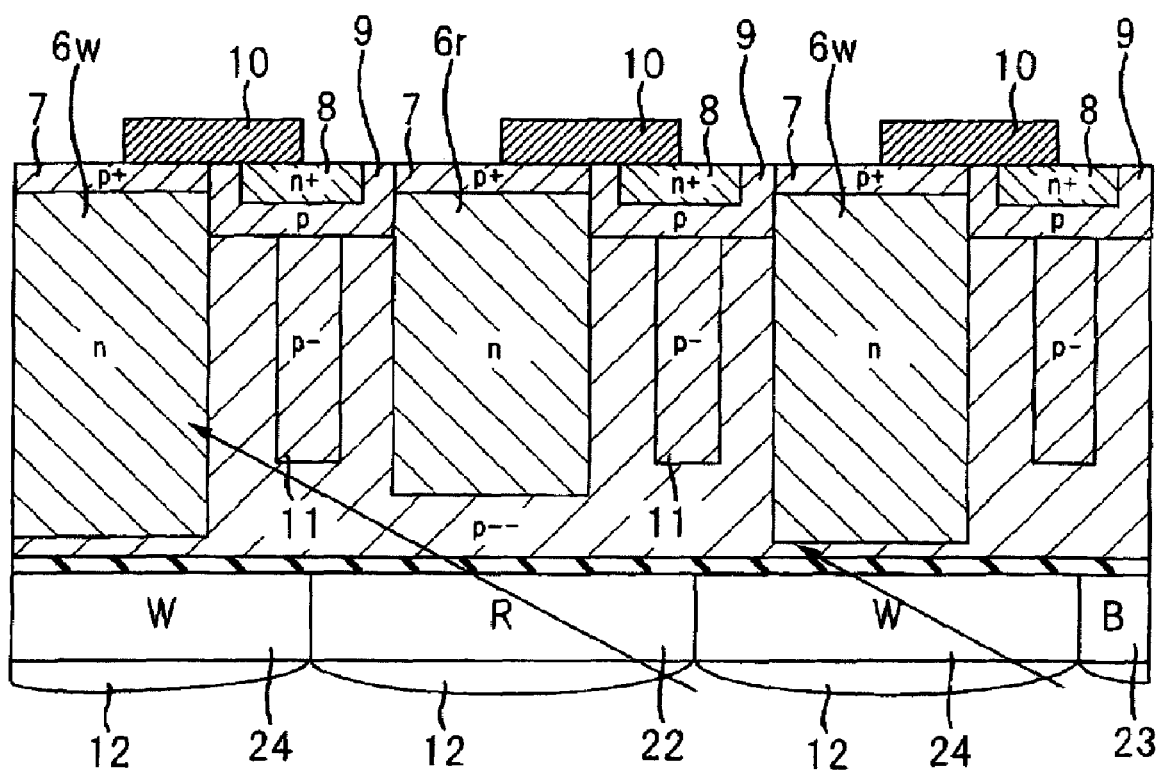
FIG. 3 is a schematic plan view of a modified embodiment as to the backside-illuminated imaging device.

Also, in the above description, as a manner in making the size of the charge accumulating area 6w larger than the size as to each of the charge accumulating areas 6r, 6g, 6b, the edge portion of the p substrate 4 on the backside thereof along the horizontal direction is made wider. However, the present invention is not limited only to the above-described manner. For example, as shown in FIG. 3, it is also possible to make the size of the charge accumulating area 6w larger by increasing a thickness of this charge accumulating area 6w in the vertical direction. As a manufacturing method of the structure of the charge accumulating area 6w shown in FIG. 2, the following can be exemplified. That is, the charge accumulating area 6w which constitutes the edge portion extended in the horizontal direction is formed by means of an ion implantation method, or the like, and thereafter, an ion implantation method is again carried out thereon, namely by executing the ion implantation method two times. In contrast thereto, in accordance with the structure shown in FIG. 3, the charge accumulating area 6w can be formed by executing an ion implantation method one time, so that manufacturing of the charge accumulating area 6w can be easily carried out.

Furthermore, in the above description, the backside-illuminated imaging device including 3 different types of the color filters and one luminance filter is exemplified. As to color filters, two different types or 4 or more different types of color filters may be employed since color images can be produced by utilizing the luminance signals acquired from the charge accumulating areas 6w.

What is claimed is:

1. A backside-illuminated imaging device that performs imaging by illuminating light from a back side of a semiconductor substrate to generate electric charges in the semiconductor substrate based on the light and reading out the electric charges from a front side of the semiconductor substrate,
  the backside-illuminated imaging device comprising:
    a plurality of charge accumulating areas in the semiconductor substrate which accumulate the electric charges; and
    a plurality of filters above a backside surface of the semiconductor substrate corresponding to the respective charge accumulating areas,
  wherein
    the plurality of filters includes different color filters which transmit different color components of the light from one another and luminance filters other than the color filters each having a spectral characteristic correlated with a luminance component of the light,
    the plurality of charge accumulating areas includes first charge accumulating areas corresponding to the respective color filters, and second charge accumulating areas corresponding to the respective luminance filters, and the second charge accumulating areas each include a third charge accumulating area such that the second charge accumulating areas each have a size larger than a size of the first accumulating areas.

2. The backside-illuminated imaging device according to claim 1, wherein the third charge accumulating area comprises an edge portion of the second charge accumulating area nearest to the back side of the semiconductor substrate.

3. The backside-illuminated imaging device according to claim 2, wherein the third charge accumulating area extends further toward the backside surface of the semiconductor substrate as compared with the first charge accumulating areas.

4. The backside-illuminated imaging device according to claim 2, wherein a width of the third charge accumulating area is greater than a width of the first charge accumulating areas in a direction parallel to the backside surface of the semiconductor substrate.

5. The backside-illuminated imaging device according to claim 2, wherein the width of the third charge accumulating area is greater than a width of the second charge accumulating areas not including the third charge accumulating area in a direction parallel to the backside surface of the semiconductor substrate.

6. The backside-illuminated imaging device according to claim 1, wherein the third charge accumulating area is located at a peripheral portion of the backside-illuminated imaging device.

7. The backside-illuminated imaging device according to claim 1, wherein sizes of third charge accumulating areas are changed depending on incident angles of light entered to luminance filters corresponding to the respective third charge accumulating areas.

8. The backside-illuminated imaging device according to claim 1, wherein a size of a first charge accumulating area corresponding to a particular color filter is substantially equal to a size of other first charge accumulating areas corresponding to other color filters which are different from said color filter.

9. The backside-illuminated imaging device according to claim 1, wherein the third charge accumulating areas substantially prevent oblique light incident on the luminance filters from entering the first charge accumulating areas by absorbing said oblique light.

10. The backside-illuminated imaging device according to claim 1, wherein the luminance filters include one or more of ND filters, transparent filters, white filters, and gray filters.

* * * * *